United States Patent [19]

Heggli

[11] Patent Number: 5,136,280
[45] Date of Patent: Aug. 4, 1992

[54] SWITCH STATUS INDICATOR AND SELF TESTER

[75] Inventor: Bjarne Heggli, Long Beach, Calif.

[73] Assignee: Teledyne Industries, Inc., Los Angeles, Calif.

[21] Appl. No.: 711,262

[22] Filed: Jun. 4, 1991

Related U.S. Application Data

[63] Continuation of Ser. No. 352,101, May 15, 1989, abandoned.

[51] Int. Cl.⁵ .................................................. G08B 21/00
[52] U.S. Cl. ........................................ 340/644; 340/635; 340/641; 324/158 R; 324/158 T
[58] Field of Search .............. 340/641, 644, 635, 642, 340/630; 250/551; 324/158 R, 158 D, 158 T, 501

[56] References Cited

U.S. PATENT DOCUMENTS

| | | | |
|---|---|---|---|
| 4,581,540 | 4/1986 | Guajardo | 361/93 X |
| 4,808,975 | 2/1989 | Hochhaus et al. | 340/641 |
| 4,884,065 | 11/1989 | Crouse et al. | 340/632 |
| 4,990,895 | 2/1991 | Juds | 340/635 |

Primary Examiner—Jin F. Ng
Assistant Examiner—Jeffrey A. Hofsass
Attorney, Agent, or Firm—Stephen L. King

[57] ABSTRACT

A solid state relay circuit which utilizes a metal oxide power semiconductor field effect transistor (MOSFET) as an output switching device to switch power to load circuitry by an electrically-isolated coupling arrangement including light emitting diodes (LEDs) and a photodiode array. An arrangement is provided for sensing the current through the LED coupling arrangement to determine when the solid state relay circuit has been operated and, in turn, to operate indicating circuitry. The circuitry may also be utilized as self testing circuitry to check the integrity of components of the input portion of the circuitry.

6 Claims, 2 Drawing Sheets

SWITCH STATUS INDICATOR AND SELF TESTER

This is a continuation of application Ser. No. 07/352,101, filed on May 15, 1989 of Bjarne Heggli now abandoned.

BACKGROUND OF THE INVENTION

1. Field of the Invention

This invention relates to solid state relay circuits and, more particularly, to solid state relay circuits having circuitry to indicate that signals have occurred to which the solid state relay circuits are to respond.

2. History of the Prior Art

A great variety of solid state relay circuits have been developed which use a power semiconductor as the output circuit switching device. Examples of such circuits and improvements thereto are disclosed in U.S. Pat. No. 4,581,540, Circuitry Overload Protected Solid State Relay, Ciro Guajardo, issued Apr. 8, 1986. Examples of other such switching circuits are shown in copending patent applications Ser. No. 07/316,189, entitled Circuitry for Indicating the Presence of an Overload or Short Circuit in Solid State Relay Circuits, Ciro Guajardo, filed Feb. 27, 1989; Ser. No. 07/316,241, entitled Circuitry for Protection Against Electromotively-Induced Voltage Transients in Solid State Relay Circuits, Ciro Guajardo, filed Feb. 27, 1989; Ser. No. 07/316,406, entitled Circuitry for Protecting Against Load Voltage Transients in Solid State Relay Circuits, Ciro Guajardo, filed Feb. 27, 1989.

Although such circuits operate well as power switching apparatus, there is often a need to know that such switching is taking place. For example, it is possible that although the circuits appear to be accomplishing their purpose, some form of circuit fault has disabled the actual operation so that nothing is occurring in the switching circuitry.

SUMMARY OF THE INVENTION

It is, therefore, an object of this invention to provide improved solid state relay circuits.

It is another object of this invention to provide circuitry for indicating that solid state relay circuits are, in fact, being furnished input signals to cause the operation of the solid state relay circuits.

It is another object of the present invention to provide circuitry for accomplishing a self test of the input circuitry of solid state relay circuits.

The foregoing and other objects of the invention are accomplished in a solid state relay circuit which utilizes a metal oxide power semiconductor field effect transistor (MOSFET) as an output switching device. The MOSFET is operated to switch power to load circuitry by an electrically-isolated coupling arrangement including light emitting diodes (LEDs) and a photodiode array. An arrangement is provided for sensing the current through the LEDs to determine when the solid state relay circuit has been operated and, in turn, to operate indicating circuitry. The circuitry may also be utilized as self testing circuitry to check the integrity of components of the input portion of the circuitry. Various specific arrangements are disclosed as well as similar arrangements for different coupling circuitry.

Other objects, features, and advantages of the invention will become apparent to those skilled in the art upon reading the following detailed description together with the several figures of the drawings in which like designations have been used for identical elements throughout the several views.

DESCRIPTION OF THE PREFERRED EMBODIMENT

Figure 1:
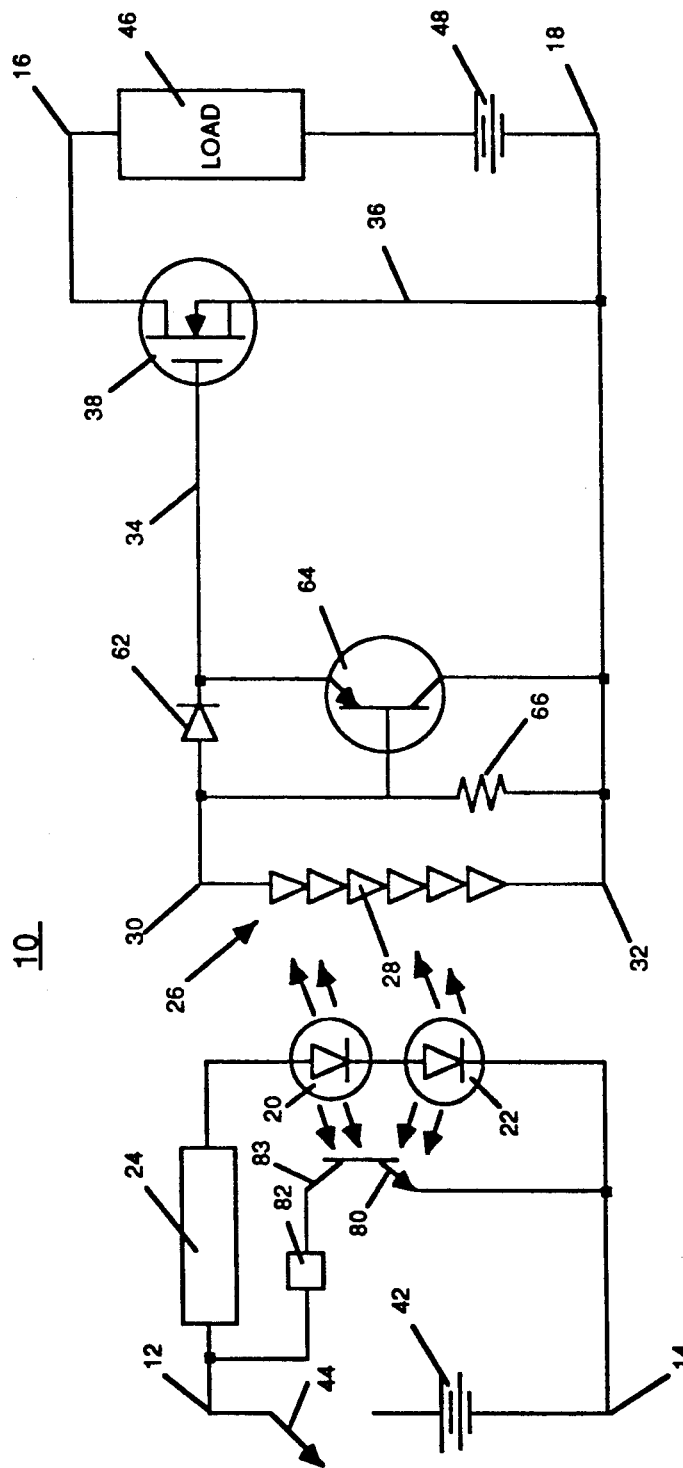
FIG. 1 is a schematic diagram of a solid state relay circuit which includes a first embodiment of the invention.

Referring to FIG. 1 there is shown a control circuit 10 constructed in accordance with the invention. The circuit 10 includes a pair of input terminals 12 and 14 and a pair of output terminals 16 and 18.

Connected between the terminals 12 and 14 is a series circuit comprising first and second light emitting diodes (LEDs) 20 and 22 and a current limiting element such as a resistor 24.

In the preferred embodiment of the invention the LEDs 20 and 22 provide infrared light output signals when activated. The LEDs 20 and 22 are positioned adjacent to and optically coupled to a photodiode array 26 having positive and negative output terminals 30 and 32, respectively. The array 26 includes a plurality of photodiodes 28 connected in series to form a photovoltaic voltage source. It is well known to those skilled in the art that a photodiode will produce a voltage and a current (approximately one half a volt at about ten microamperes for a small area silicon diode) in response to light impinging on the surface thereof. The amount of current available from a particular photodiode is proportional to the amount of light impinging on its surface.

By connecting in series a plurality of photodiodes 28, the voltages generated by each are added to produce a desired voltage level at the output terminals 30 and 32 of the array 26. In the preferred embodiment, sixteen photodiodes 28 are connected in series to produce an output voltage of about eight volts at a current level of about ten microamperes in response to light from the LEDs 20 and 22; this voltage is sufficient to operate the output switching device of the circuit.

The positive terminal 30 of the array 26 is connected by a diode 62 to the gate terminal 34 of an N-channel, enhancement mode MOSFET 38. The negative terminal 32 of the array 26 is connected to the source terminal 36 of the MOSFET 38, and the drain and source terminals of the MOSFET 38 are, in turn, connected respectively to the circuit output terminals 16 and 18.

Power MOSFETs are characterized by their ability to switch several amperes of current between their output (drain and source terminals) from a power source of up to several hundred volts. These devices exhibit low output resistance in the on, or conducting, state (typically one-one hundredth of an ohm to ten ohms) and exhibit high output resistance in the off, or non-conducting state (typically one to ten megohms). A typical MOSFET device for use in the invention is type number IRF520, supplied by International Rectifier, El Segundo, Calif., or RSP 12N10 manufactured by RCA.

The MOSFET 38 is biased into full conduction by the application of a first level of voltage (typically six to eight volts) between the gate and source terminals 34 and 36. The first level of voltage is referred to as the turn-on voltage of the MOSFET 38. When the gate to source voltage is below a second level of voltage (typically 3 to 5 volts) the MOSFET 38 is biased into a non-conducting state. This second level of voltage is referred to as the turn-off voltage of the MOSFET 38.

The operation of the circuit 10 as discussed thus far is as follows. An input signal is applied to the input terminals 12 and 14 by, for example, connecting a voltage source 42 across the terminals 12 and 14 using a switch 44 as shown in FIG. 1. In response to the input signal, the LEDs 20 and 22 generate light. This light is optically coupled to the diode array 26 which causes it to produce a voltage across the gate and source terminals 34 and 36 of the MOSFET 38. The MOSFET 38 is biased into full conduction providing a low impedance current path across the output terminals 16 and 18. When the MOSFET 38 is conducting, power is applied to a load 46 from a power source 48. The load 46 and the source 48 are connected in series across the terminals 16 and 18 as shown in FIG. 1. When the switch 44 is opened, the LEDs 20 and 22 no longer generate light. Consequently, the voltage provided by the array 26 drops to zero, and the MOSFET 38 turns off.

Connected between the terminal 30 of the array 26 and the gate terminal 34 of the MOSFET 38 is the diode 62 oriented to permit current flow toward the gate terminal 34. A PNP bipolar transistor 64 is provided having its emitter terminal connected to the gate terminal 34, its collector terminal connected to the source terminal 36 of the MOSFET 38, and its base terminal connected to the terminal 30 of the array 26. A resistor 66 is connected across the terminals 30 and 32 of the array 26. The PNP transistor 64 is normally non-conducting during the operation of the MOSFET 38. However, it is biased into conduction between its emitter and collector terminals when the array 26 ceases generating voltage thereby acting to speed up the turn-off time of the MOSFET 38 by providing a discharge path for the inherent capacitance associated with the gate-source elements of the MOSFET 38. The diode 62 couples the bias voltage from the array 26 to the gate 34 of the MOSFET 38. Accordingly, the MOSFET 38 responds to closures of the switch 44 by switching into a conducting state. When the switch 44 is opened, the MOSFET 38 switches to a nonconducting state in an extremely short interval of time due in part to the conduction of the transistor 64.

The circuit 10 described above is especially useful in many situations. However in many cases, it would be desirable to know that the circuit 10 is actually functioning. To this end, a phototransistor 80 is arranged in juxtaposition to the LEDs 20 and 22 to receive light therefrom. The transistor 80 has an emitter terminal connected to the input terminal 14 for bias. The collector 83 of the transistor 80 is connected to an external indicator 82. The indicator 82 may be an LED to give a visual indication or a resistor used to produce a signal which may be sent to a computer for use in a program or some other component well known in the art.

When the switch 44 is closed to apply current through the resistor 24 to the LEDs 20 and 22, the infrared light generated by those LEDs causes the phototransistor 80 to conduct thereby pulling the collector 83 towards ground 14 and lighting the indictor 82 if an LED is used. The collector 83 thus provides an indication that the input circuit of the relay switching circuit 10 has been provided an input signal. As pointed out, this is a desirable result in many situations where switch status information is required.

Another advantage of the circuit including the phototransistor 80 and the indicator 82 is that it may be used to provide a built in test function for the input of the relay switching circuitry. If the input circuitry is provided an input signal, then the indicator 82 will function unless some portion of the input circuitry is malfunctioning. By knowing when an input signal is provided and reviewing the response of the indicator 82, the condition of the components of the input circuitry may be ascertained.

Figure 2:
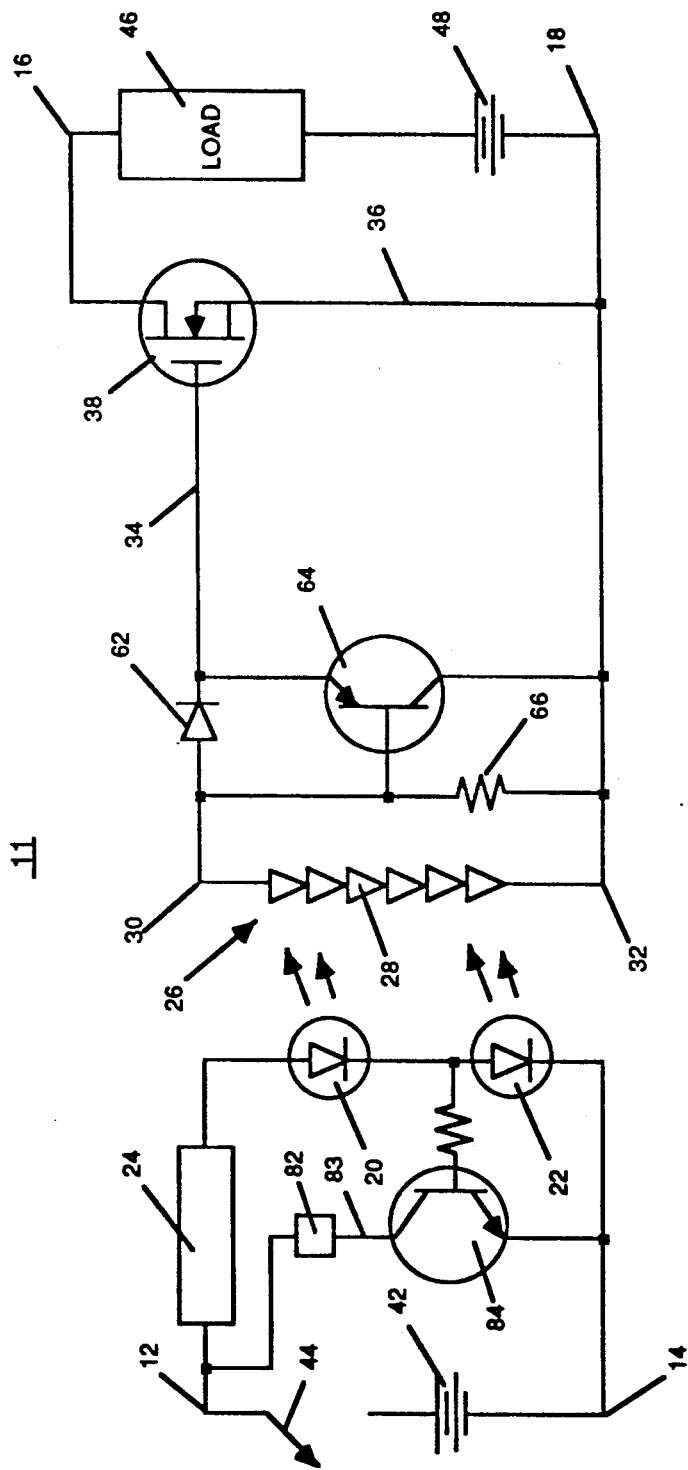
FIG. 2 is a schematic diagram of a solid state relay circuit which includes a second embodiment of the invention.

FIG. 2 illustrates a second relay switching circuitry including an arrangement for providing indications of the status of the switching relay and for ascertaining the condition of the input circuitry. The circuit 11 illustrated in FIG. 2 has most of the same components as that of FIG. 1. However, the indicating and self-test circuitry is differently arranged. The circuit 11 has a NPN transistor 84 with its base terminal connected between the LEDs 20 and 22. The transistor 84 has an emitter terminal connected to the input terminal 14 for bias. The collector of the transistor 84 is connected in circuit with the indicator 82 which again may be an LED or a resistor for transferring a signal to a computer program or other sensing arrangement.

When the switch 44 is closed to apply current through the resistor 24 to the LEDs 20 and 22, the current through those LEDs 20 and 22 causes the transistor 84 to conduct thereby pulling collector 83 towards the voltage at 14. The indicator 82 thus provides an indication that the input circuit of the relay switching circuit 10 has been provided an input signal. This indicating arrangement may also be utilized as a built-in testing arrangement for the input of the switching relay circuit.

Although the present invention has been described in terms of a preferred embodiment, it will be appreciated that various modifications and alterations might be made by those skilled in the art without departing from the spirit and scope of the invention. For example, individual comparators might be used across the individual LEDs 20 and 22 to detect proper operation of the input circuitry. Moreover, various other devices such as PNP transistors, field effect transistors, and MOSFETs might be utilized to provide input current to the indicator 82. The invention should therefore be measured in terms of the claims which follow.

What is claimed is:

1. A method for testing switch condition and input circuit continuity of a solid state relay circuit which circuit includes a power semiconductor field effect transistor as an output switching device and an electrically-isolated coupling arrangement to provide an input to the power semiconductor field effect transistor including light emitting diodes (LEDs) and a photodiode array, the method comprising the steps of sensing operating current through the LEDs of the electrically-isolated coupling arrangement each time an attempt is made to normally operate the solid state relay circuit during a switching operation, and indicating in response to the sensing of operating current through the LEDs that the solid state relay circuit has probably been operated and that the input circuitry is operating properly.

2. A method for testing switch condition and input circuit continuity of a solid state relay circuit as claimed in claim 1 in which the step of sensing operating current through the LEDs of the electrically-isolated coupling arrangement comprises sensing the light generated by the LEDs by means of a phototransistor.

3. A method for testing switch condition and input circuit continuity of a solid state relay circuit as claimed in claim 1 in which the step of sensing operating current through the LEDs of the electrically-isolated coupling arrangement comprises sensing current through at least one of the the LEDs using a base-emitter terminal path of a transistor connected to respond to the presence of current therethrough.

4. A method for testing switch condition and input circuit continuity of a solid state relay circuit as claimed in claim 1 in which the step of indicating in response to the sensing of operating current through the LEDs that the solid state relay circuit has probably been operated and that the input circuitry is operating properly comprises lighting a LED.

5. A method for testing switch condition and input circuit continuity of a solid state relay circuit as claimed in claim 1 in which the step of indicating in response to the sensing of operating current through the LEDs that the solid state relay circuit has probably been operated and that the input circuitry is operating properly comprises transferring a signal indicating the response to receiving circuitry.

6. A method for testing switch condition and input circuit continuity of a solid state relay circuit which circuit includes a power semiconductor field effect transistor as an output switching device and including an electrically-isolated coupling arrangement to provide an input to the power semiconductor field effect transistor including an input circuit and a switching circuit, the method comprising the steps of sensing operating current flow through the input circuit to provide an indication that input current is flowing each time an attempt is made to normally operate the solid state relay circuit during a switching operation, and indicating in response to the sensing of operating current through the input circuit that the solid state relay circuit has probably been operated and that the input circuitry is operating properly.

* * * * *